(12) United States Patent
Kubota et al.

(10) Patent No.: US 7,638,439 B2
(45) Date of Patent: Dec. 29, 2009

(54) PERIPHERAL PROCESSING METHOD AND METHOD OF MANUFACTURING A SEMICONDUCTOR DEVICE

(75) Inventors: Takeo Kubota, Ibaraki-ken (JP);
Atsushi Shigeta, Kanagawa-ken (JP);
Kaori Yomogihara, Hyogo-ken (JP);
Makoto Honda, Kanagawa-ken (JP);
Hirokazu Ezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 231 days.

(21) Appl. No.: 11/604,786

(22) Filed: Nov. 28, 2006

(65) Prior Publication Data
US 2007/0264822 A1 Nov. 15, 2007

(30) Foreign Application Priority Data
Nov. 30, 2005 (JP) .............................. 2005-345800

(51) Int. Cl.
*H01L 21/31* (2006.01)
(52) U.S. Cl. ................. 438/770; 438/762; 257/E21.016
(58) Field of Classification Search ................. 438/770, 438/762, 778, 660
See application file for complete search history.

(56) References Cited
U.S. PATENT DOCUMENTS
6,291,315 B1 9/2001 Nakayama et al.

2005/0087289 A1 * 4/2005 Toyoda ........................ 156/230

FOREIGN PATENT DOCUMENTS
JP 06-084887 3/1994

* cited by examiner

*Primary Examiner*—Phat X Cao
*Assistant Examiner*—Nga Doan
(74) *Attorney, Agent, or Firm*—Finnegan, Henderson, Farabow, Garrett & Dunner, L.L.P.

(57) ABSTRACT

A peripheral processing method includes: by at least one of locally heating the periphery of a workpiece including a silicon-based substrate and selectively supplying reacting activation species to the periphery, allowing oxidation rate on the periphery to be higher than oxidation rate of native oxide film on a surface of the silicon-based substrate, thereby forming a first oxide film along the periphery, the first oxide film being thicker than the native oxide film. A method of manufacturing a semiconductor device includes: forming an insulating film on a frontside and periphery of a silicon-based substrate; forming a workpiece by selectively etching away the insulating film to expose a portion of the frontside of the silicon-based substrate; forming a first oxide film at an exposed part of the silicon-based substrate, the exposed part being formed in the insulating film of the periphery during the selective etching; depositing a metal film on the frontside of the workpiece after the first oxide film is formed; and allowing the metal film to react with the portion of the frontside of the silicon-based substrate by heat treatment.

17 Claims, 16 Drawing Sheets

PERIPHERAL PROCESSING METHOD AND METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 2005-345800, filed on Nov. 30, 2005; the entire contents of which are incorporated herein by reference.

BACKGROUND OF THE INVENTION

1. Field of the Invention

This invention relates to a method of processing the periphery of a silicon-based substrate and a method of manufacturing a semiconductor device based thereon.

2. Background Art

A semiconductor device is manufactured using a semiconductor substrate such as a silicon (Si) substrate and a sequence of multiple steps including lithography, etching, heat treatment (oxidation, annealing, and diffusion), ion implantation, thin film formation (CVD, sputtering, and vapor deposition), and washing (resist removal and washing with solution).

For example, after a nitride film is deposited on a Si substrate, a resist film is applied onto the nitride film and used as a mask to form an opening on the Si substrate by lithography and reactive ion etching. Then a metal film is deposited on the nitride film and heat treated so that the surface of the Si substrate exposed in the opening reacts with the metal to form a silicide film. The unreacted metal film is removed by etching or the like.

However, if the resist film is not sufficiently applied to the periphery of the Si substrate, the Si substrate may be exposed on the periphery when an opening is formed on the Si substrate. If a metal film is deposited and heat treated on the Si substrate being exposed, the Si substrate exposed on the periphery reacts with the metal to produce a silicide film or other reaction product from the metal film and the Si substrate. Unfortunately, this causes metal contamination occurring from the periphery of the Si substrate. To prevent metal contamination, it is known to conduct a process for selectively removing the metal film on the periphery by etching or the like after the silicide film or other reaction product is formed. However, it is difficult to completely remove the silicide film or other reaction product once formed. To prevent the formation of silicide film on the periphery beforehand, it is possible to use a jig called an edge cut ring. However, because this edge cut ring is in contact with the Si substrate, particles are generated from the contact portion and deteriorate the manufacturing yield.

On the other hand, with the enhancement of speed and integration of recent semiconductor devices, there has been a growing trend to use copper (Cu), which has lower electric resistance and higher electromigration tolerance than Al, as a metal material for forming interconnect circuits on a semiconductor substrate. However, there is a concern about Cu contamination of the Si substrate. To prevent Cu contamination of the Si substrate, it is known to conduct a method of forming Cu interconnects after covering the backside and the periphery of the Si substrate with a nitride film beforehand. However, processes such as chemical mechanical polishing (CMP) or reactive ion etching (RIE) in the step of forming Cu interconnects induce the nitride film covering the periphery to be eliminated. If heat treatment is applied while the nitride film is eliminated, Cu diffuses into and contaminates the Si substrate. Thus, to manufacture a semiconductor device with high yield requires protecting the Si substrate against contamination. Various countermeasures for this have been attempted conventionally (see, e.g., JP 6-084887A).

SUMMARY OF THE INVENTION

According to an aspect of the invention, there is provided a peripheral processing method including: by at least one of locally heating the periphery of a workpiece including a silicon-based substrate and selectively supplying reacting activation species to the periphery, allowing oxidation rate on the periphery to be higher than oxidation rate of native oxide film on a surface of the silicon-based substrate, thereby forming a first oxide film along the periphery, the first oxide film being thicker than the native oxide film.

According to other aspect of the invention, there is provided a method of manufacturing a semiconductor device including: forming an insulating film on a frontside and periphery of a silicon-based substrate; forming a workpiece by selectively etching away the insulating film to expose a portion of the frontside of the silicon-based substrate; forming a first oxide film at an exposed part of the silicon-based substrate, the exposed part being formed in the insulating film of the periphery during the selective etching; depositing a metal film on the frontside of the workpiece after the first oxide film is formed; and allowing the metal film to react with the portion of the frontside of the silicon-based substrate by heat treatment.

According to other aspect of the inventions there is provided a method of manufacturing a semiconductor device including: forming a workpiece having a first insulating film on a periphery of a silicon-based substrate and a second insulating film including a recess on a frontside of the silicon-based substrate, the recess being formed by selectively etching away the second insulating film; forming a first oxide film at an exposed part of the silicon-based substrate, the exposed part being formed in the first insulating film of the periphery during forming of the recess; and depositing a metal film on the frontside of the workpiece after the first oxide film is formed.

DETAILED DESCRIPTION OF THE INVENTION

Figure 1:
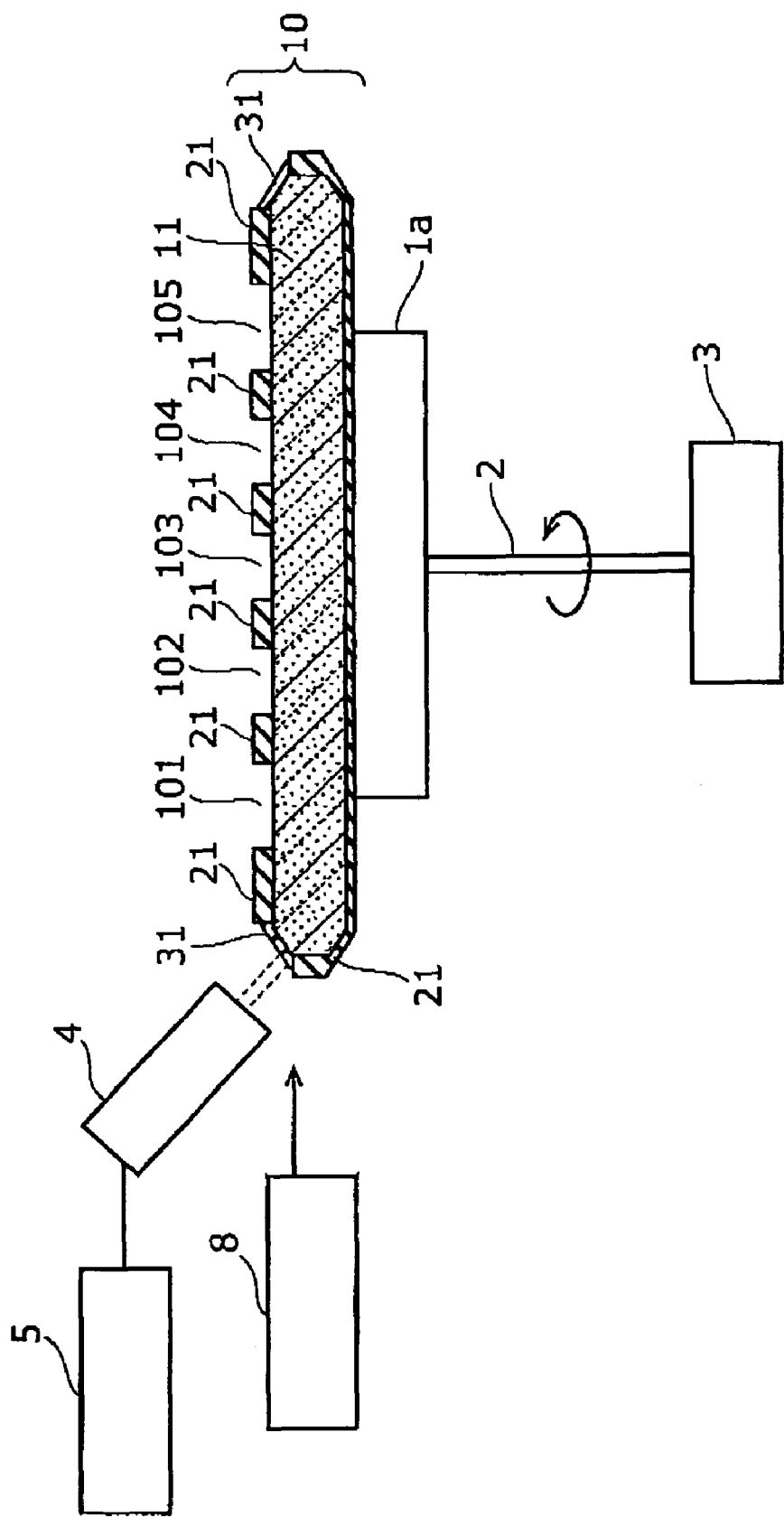
FIG. 1 is a schematic view illustrating an example peripheral processing apparatus according to a first embodiment of the invention.

Embodiments of the invention will now be described with reference to the drawings. In the following description of the drawings, like or similar elements are marked with like or similar reference numerals. The figures are schematic, and hence the relationship between the thickness and the planar dimensions, the ratio of thickness of the layers, and the like are different from actual ones. Therefore the specific thicknesses and dimensions should be understood in light of the following description. Furthermore, it is understood that the relationship or ratio of some dimensions may be different from each other in various figures.

The embodiments of the invention illustrate a peripheral processing method and a method of manufacturing a semiconductor device based thereon. A workpiece including a Si-based substrate (Si substrate) is subjected to at least one of locally heating the periphery of the Si-based substrate and selectively supplying reacting activation species to the periphery. Thus the oxidation rate on the periphery is made higher than the oxidation rate of native oxide film on the surface of the Si-based substrate, thereby forming an oxide film along the periphery, the oxide film being thicker than native oxide film.

The Si-based substrate used herein includes a Si substrate and compound substrates containing Si such as a silicon carbide (SiC) and a silicon germanium (SiGe) substrate. While the following embodiments are illustrated with reference to a Si substrate, they are not limited to the Si substrate.

The "workpiece including a Si-based substrate" includes a Si-based substrate (Si-based wafer) per se cut out from an ingot, a so-called epitaxial growth substrate in which epitaxial growth is conducted on a Si-based substrate, and an SOI substrate or other composite structure of Si with other material, and further includes these substrates with a thin film formed thereon. Furthermore, the workpiece also includes various intermediate products in intermediate steps of the process of manufacturing a semiconductor device. The term "locally heating" can refer to the light irradiation heating illustrated in the first embodiment. The term "selectively supplying reacting activation species" refers to a concept that includes selectively supplying reacting activation species which promote the oxidation of a Si-based substrate. In the second embodiment, this is illustrated as supplying reacting activation species by supplying a chemical solution. The "reacting activation species" may be ions implanted into a Si-based substrate via vacuum such as in ion implantation. The reacting activation species in this case include phosphorus (P), arsenic (As) and the like. Furthermore, impurity ions serving as reacting activation species may be introduced into a Si-based substrate by solid-phase diffusion.

The phrase "at least one of locally heating . . . and selectively supplying reacting activation species to the periphery" implies that the local heating and the selective supply of reacting activation species may be simultaneously conducted. The first embodiment illustrates a case that, during local heating by light irradiation, a reactive gas is supplied from the vapor phase to selectively supply reacting activation species.

First Embodiment

As shown in FIG. 1, for example, a peripheral processing apparatus according to the first embodiment of the invention comprises a stage 1a for circumferentially rotating a workpiece 10 including a Si-based substrate and a laser oscillator 4 for oscillating laser light to locally heat the periphery of the workpiece 10.

The stage 1a is subjected to the rotary drive of a driving motor 3 via a rotary shaft 2, and hence can be rotary driven around the rotary shaft 2. Furthermore, the stage 1a has a vacuum chuck and the like to retain the workpiece 10. The diameter of the stage 1a is typically smaller than the diameter of the workpiece 10, and only the backside central portion of the workpiece 10 is mounted on the stage 1a.

The laser oscillator 4 may be a Nd:YAG laser, for example. The intensity and the like of laser light oscillated from the laser oscillator 4 can be controlled by a controller 5 connected to the laser oscillator 4. For example, the position of the laser oscillator 4 can be controlled by the controller 5 so that the laser oscillator 4 can oscillate laser light perpendicular to the end face of the periphery of the workpiece 10. Instead of rotating the stage 1a, the laser oscillator 4 can be rotated. Instead of the laser oscillator 4, a flash lamp, halogen lamp or the like filled with xenon (Xe) or other gas can be used to locally heat the periphery of the workpiece 10. During local heating, a reactive gas supply unit 8 provided in the peripheral processing apparatus can be used to supply the periphery of the workpiece 10 with a reactive gas containing oxygen ($O_2$) or other reacting activation species.

On the workpiece 10 retained on the stage 1a, an insulating film 21 such as a $SiO_2$ film or nitride ($Si_3N_4$) film is formed on the frontside, backside, and periphery of the Si substrate 11. The "frontside" used herein refers to the surface on the side where semiconductor devices, metal layers connecting between the semiconductor devices, and the like are formed. The "backside" refers to the surface opposed to the frontside. The "periphery" is a region in the vicinity of the edge of the disc-shaped workpiece 10 such as a Si wafer including the edge and the adjacent portion having a beveled cross section.

Openings 101, 102, 103, 104, 105 are formed on the frontside of the workpiece 10. The Si substrate 11 is exposed through the openings 101 to 105. An oxide film (first oxide film) 31 having a film thickness of about 5 to 10 nm is formed on the Si substrate 11 exposed in part of the periphery of the workpiece 10. The oxide film 31 is formed by forced oxidation due to local heating with light oscillated by the laser oscillator 4.

Figure 2:
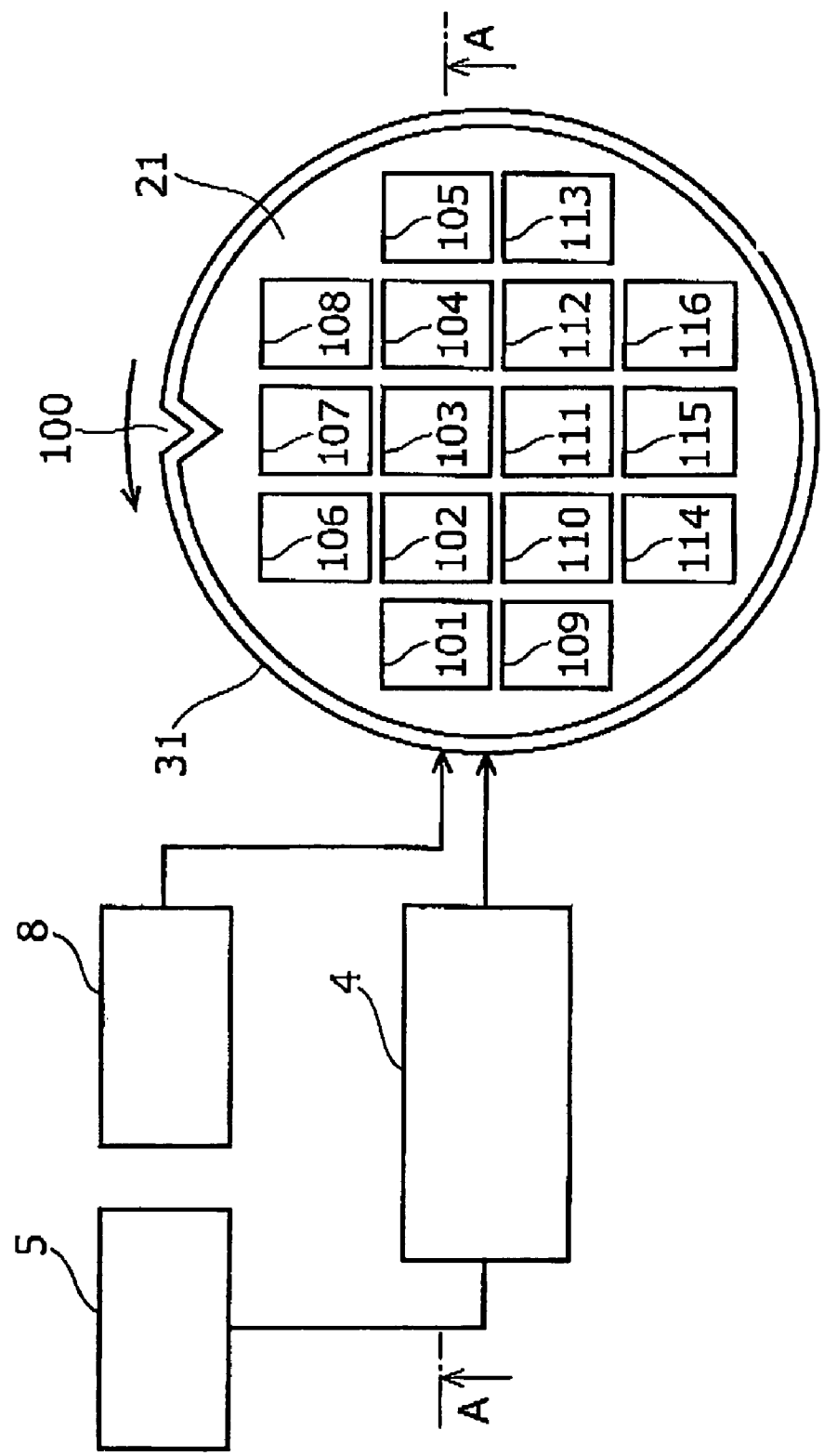
FIG. 2 is a schematic top view illustrating an example workpiece mounted on the peripheral processing apparatus according to the first embodiment of the invention.

FIG. 2 shows a plan view of an example workpiece 10 as viewed from the frontside where the openings 101 to 105 are formed as shown in FIG. 1. Openings 101, 102, 103, 104, 105, 106, 107, 108, 109, 110, 111, 112, 113, 114, 115, 116 are formed in a matrix configuration in the insulating film 21 on the frontside of the workpiece 10. A notch 100 is formed on the periphery of the workpiece 10. Instead of the notch 100, a truncated portion called an orientation flat may be formed on the periphery of the workpiece 10. An oxide film 31 is formed on the periphery of the workpiece 10 where part of the frontside of the Si substrate 11 is exposed, and on the notch 100.

An example method of manufacturing a semiconductor device based on the peripheral processing method according to the first embodiment of the invention is described with reference to FIGS. 3 to 10.

Figure 3:
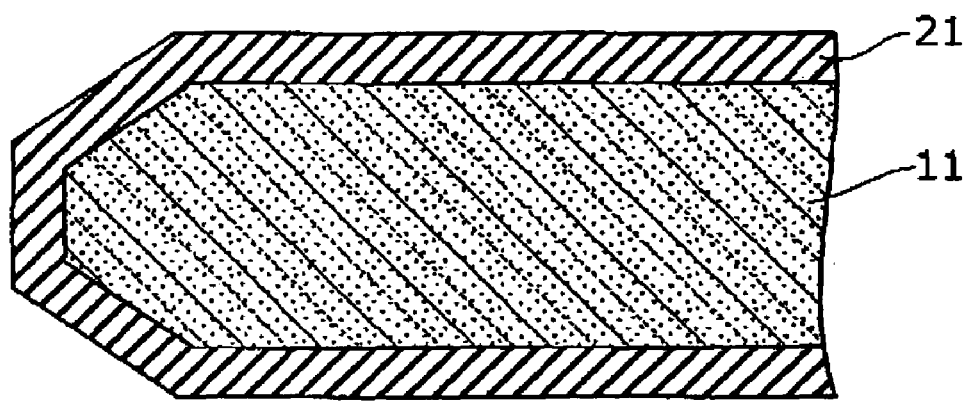
FIGS. 3 to 10 are process cross sections illustrating an example peripheral processing method according to the first embodiment of the invention.
Figure 4:
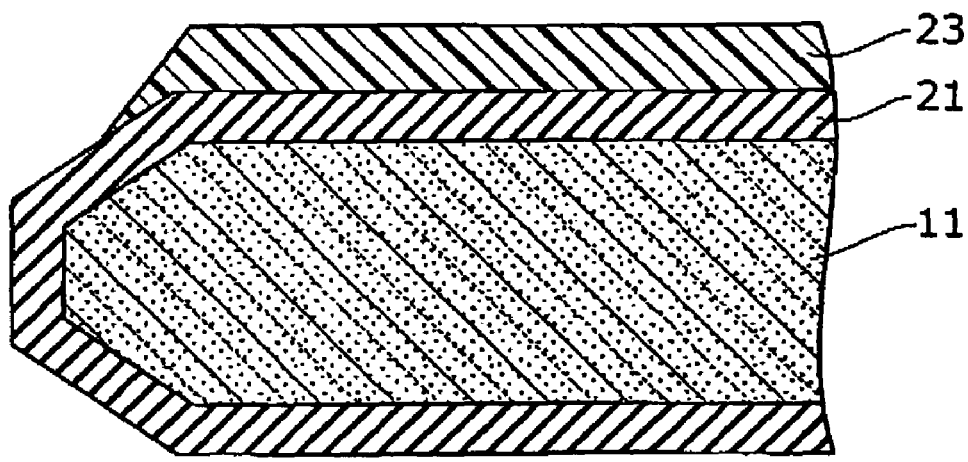

(a) As shown in FIG. 3, an insulating film 21 of about 30 nm, for example, is formed on the frontside, backside, and periphery of the Si substrate 11 by thermal oxidation or chemical vapor deposition (CVD). The insulating film 21 can be made of $Si_3N_4$ film, for example. A wafer transfer robot or the like (not shown) is used to transfer the Si substrate 11 shown in FIG. 3 onto a spinner stage configured as shown in FIG. 1. The Si substrate 11 is fixed to the spinner stage using a vacuum chuck or the like. Then a resist solution is supplied onto the frontside of the Si substrate 11, and the spinner stage is rotated to apply a resist film 23 onto the insulating film 21 as shown in FIG. 4. While an example of using a resist film 23 is described herein, a photosensitive resin film or the like other than the resist film 23 can also be used.

Figure 5:
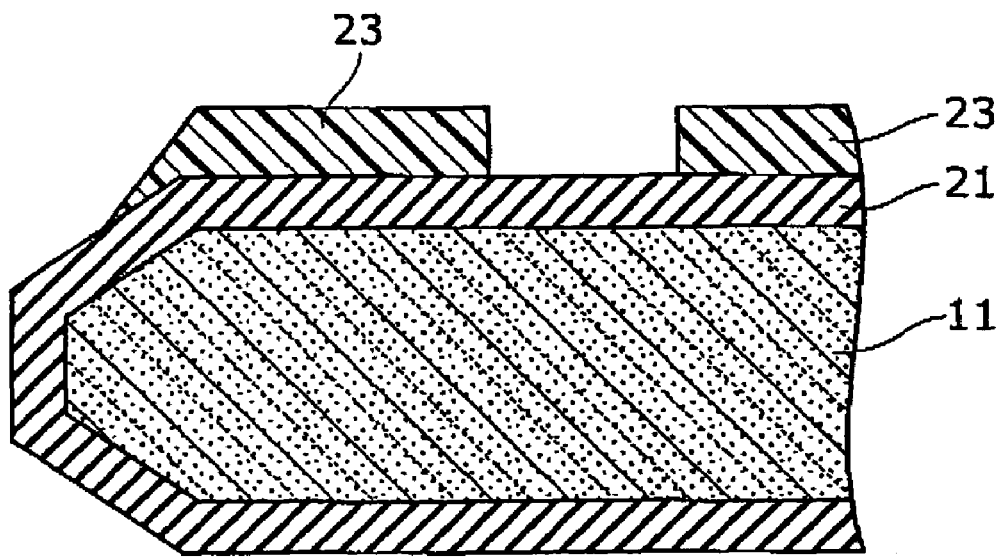
Figure 6:
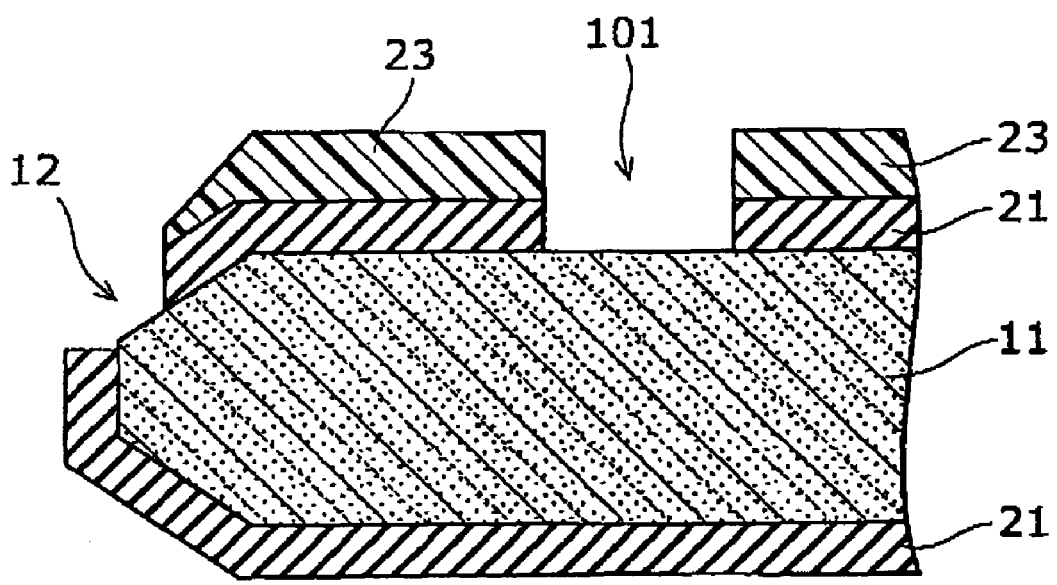
Figure 7:
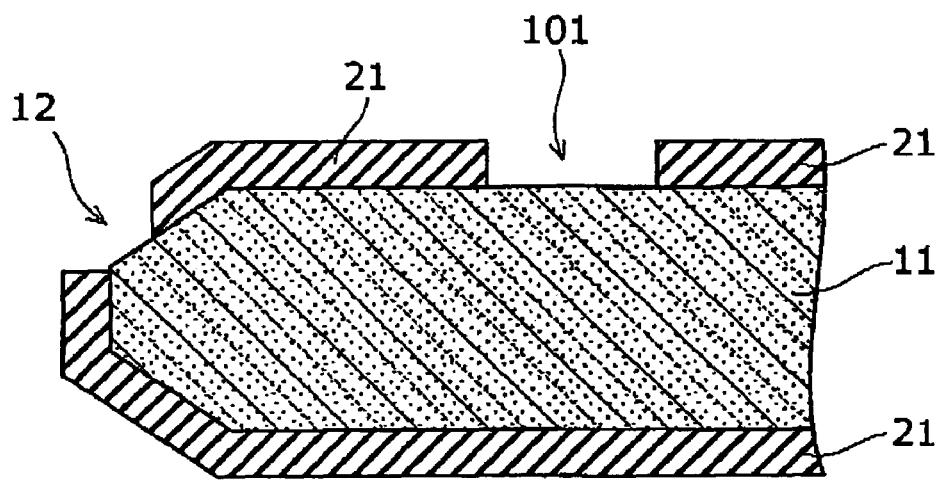

(b) The Si substrate 11 is removed from the spinner stage, and then the resist film 23 is developed by exposure using photolithography as shown in FIG. 5. The resist film 23 is used as an etching mask to etch the insulating film 21 by RIE or other technique, thereby forming an opening 101. Thus, as shown in FIG. 6, part of the frontside of the Si substrate 11 is selectively exposed. At this time, an exposed part 12 of Si may be formed around the periphery of the Si substrate 11 due to nonuniform application of the resist film 23. In the following description, it is assumed that the exposed part 12 is formed. Subsequently, as shown in FIG. 7, a resist stripping system or the like is used to remove the resist film 23 applied on the insulating film 21.

Figure 8:
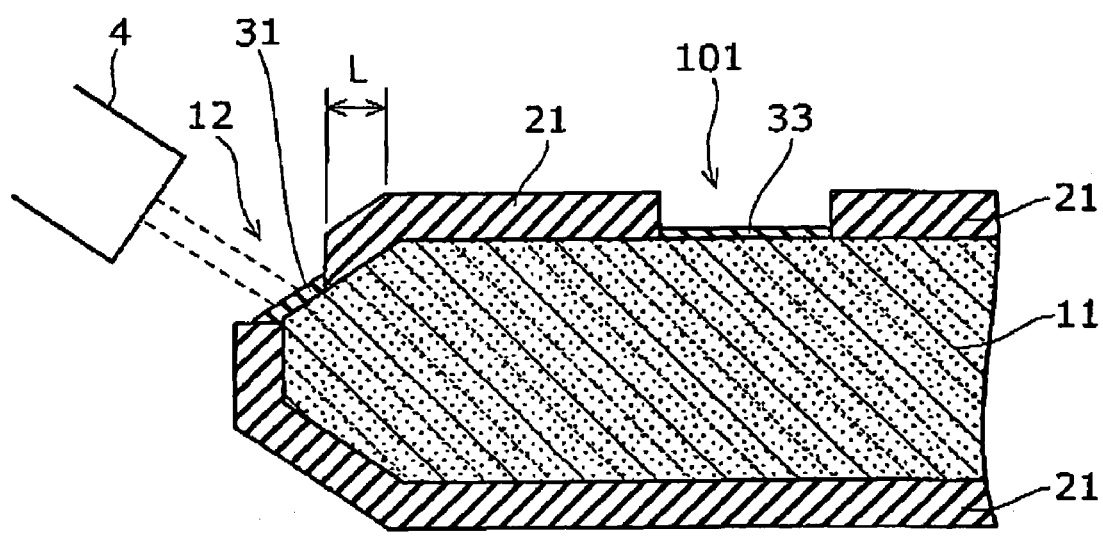

(c) The Si substrate 11 is transferred onto the stage 1a shown in FIG. 1 and fixed to the stage 1a using a vacuum chuck or the like. Then, as shown in FIG. 8, the exposed part 12 located around the periphery of the Si substrate 11 is irradiated with laser light directed from the laser oscillator 4, and the exposed part 12 is locally heated at about 1000° C., for example. The local heating can be conducted while rotating the stage 1a so as to heat a portion of the periphery located a distance L outside the edge (end portion of the flat surface) of the Si substrate 11, for example. The distance L can be selected to be about 0.1 mm, for example, but other dimensions can also be used.

(d) For locally heating the exposed part 12, a flash lamp, halogen lamp or the like can also be used instead of the laser oscillator 4. To promote oxidation, it is possible to selectively supply the periphery of the Si substrate 11 with a reactive gas containing reacting activation species for oxidation such as oxygen ($O_2$). The reactive gas supply unit 8 may be a nozzle, for example. Consequently, an oxide film 31 having a film thickness of about 5 to 10 nm, for example, is formed on the exposed part 12. On the other hand, in the opening 101 that is not irradiated with laser light, a native oxide film 33 having a film thickness of about 0.2 to 0.4 nm, for example, is formed, where the film thickness also depends on the conductivity type, impurity density, and surface orientation of the Si substrate 11. For example, in the case of an n(100) Si substrate, a native oxide film of about 0.2 to 0.3 nm is formed when the substrate is left standing at room temperature in the atmosphere for one hour. Furthermore, the notch 100 shown in FIG. 2 is locally heated by the laser oscillator 4 or the like to oxidize the exposed part of the Si substrate 11.

Figure 9:
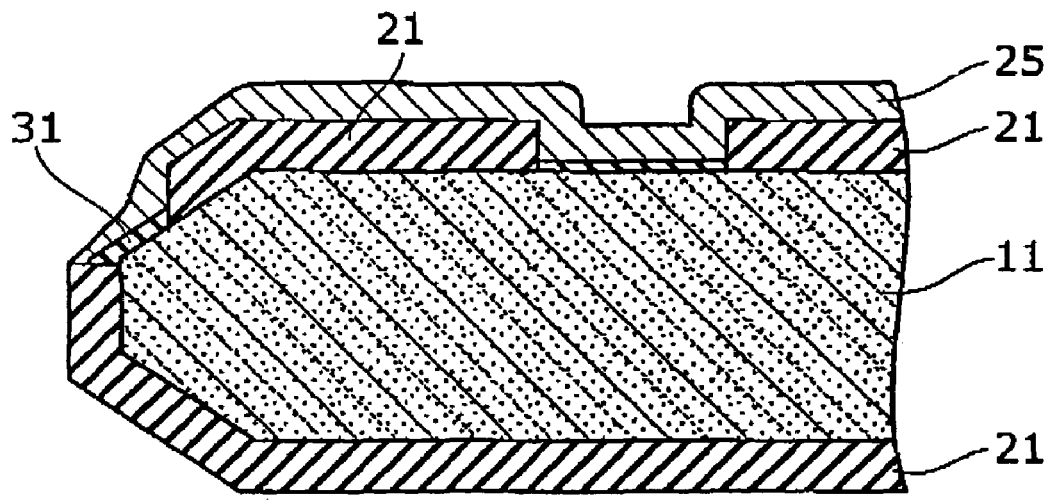
Figure 10:
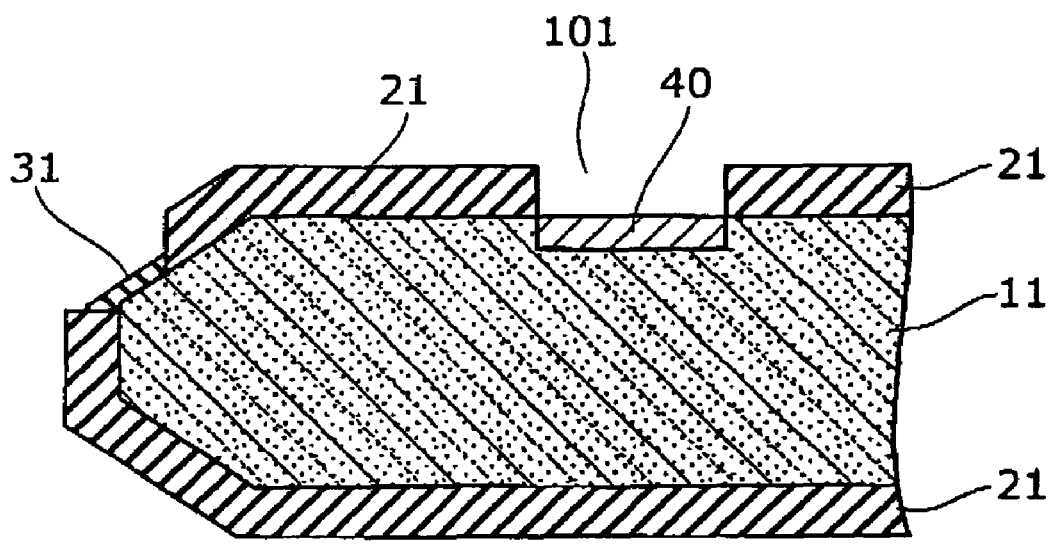

(e) The Si substrate 11 shown in FIG. 8 is washed to remove the native oxide film 33. Then, as shown in FIG. 9, a metal film 25 of cobalt (Co) or the like is deposited on the insulating film 21 with a thickness of 10 to 100 nm by sputtering. Subsequently, heat treatment is conducted to allow the Si substrate 11 exposed in the opening 101 to selectively react with the metal film 25, and the unreacted metal film 25 is removed. Thus, as shown in FIG. 10, a silicide film 40 of cobalt silicide (CoSi, $CoSi_2$) or the like is formed on the surface of the Si substrate 11 exposed in the opening 101. At this time, the exposed part 12 formed on the periphery is protected against the formation of silicide film because the oxide film 31 has been formed on the exposed part 12.

According to the method of manufacturing a semiconductor device of the first embodiment, an oxide film 31 thicker than the native oxide film 33 is formed beforehand on the exposed part 12 of Si that has been exposed on the periphery as a result of etching or the like. Thus it is possible to prevent silicide film from being formed on the periphery during the formation of silicide film. Therefore the Si substrate 11 is protected against metal contamination occurring from the periphery.

The first embodiment illustrates the formation of silicide film as a result of the reaction of the Si substrate 11 with metal. However, there is also no problem if other reaction products including silicide film are formed as a result of the reaction of a SiC substrate or a SiGe substrate with metal.

Variation

Figure 11:
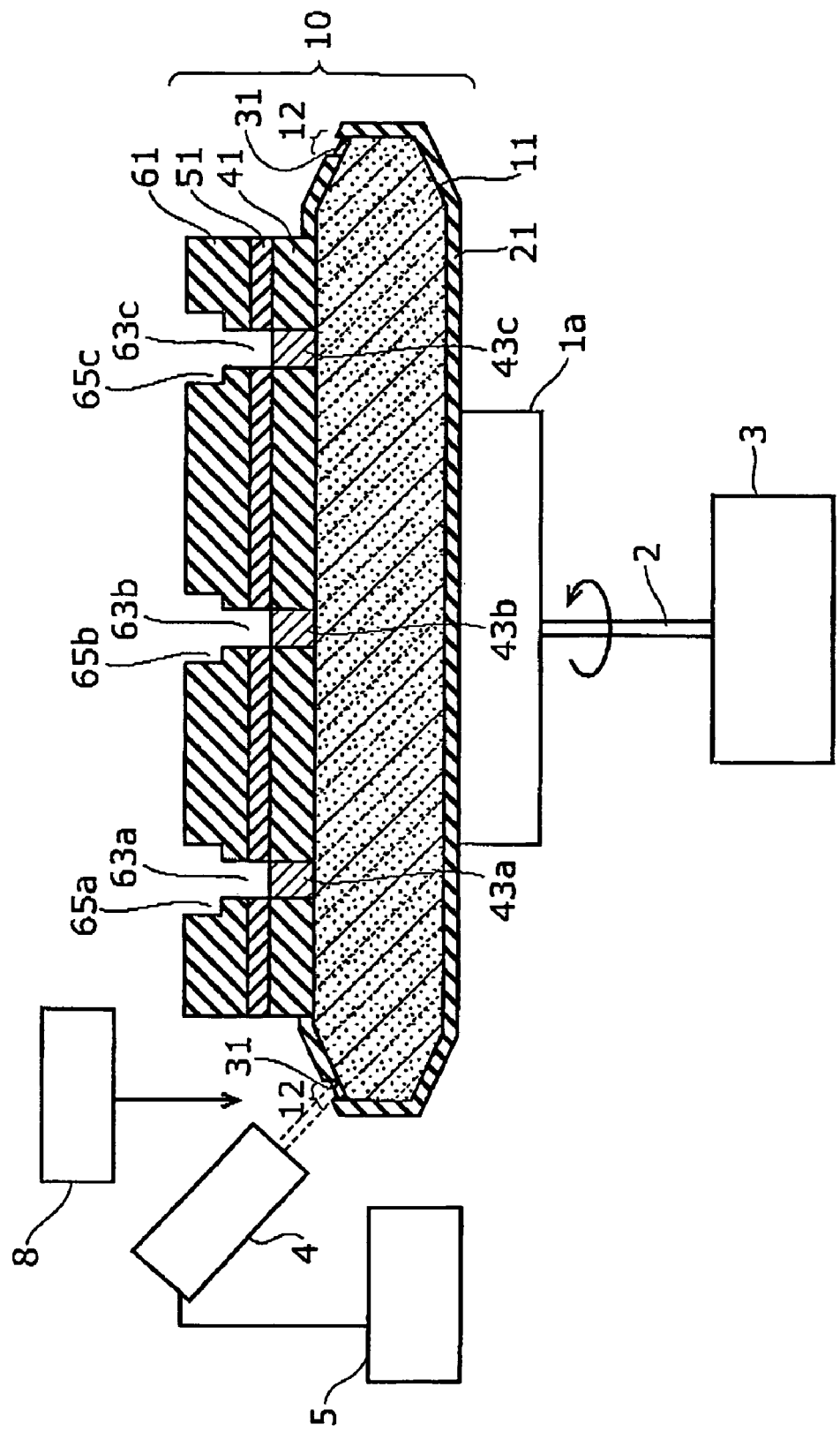
FIG. 11 is a schematic view illustrating an example peripheral processing apparatus according to a variation of the first embodiment of the invention.

As shown in FIG. 11, for example, a peripheral processing apparatus according to a variation of the first embodiment comprises a stage 1a for circumferentially rotating a disc-shaped workpiece 10 and a laser oscillator 4 for oscillating laser light to locally heat the periphery of the workpiece 10. The apparatus has substantially the same structure as that shown in FIG. 1.

The workpiece 10 retained on the stage 1a has a first insulating film 21 such as a $SiO_2$ film or $Si_3N_4$ film formed on the backside and periphery of the Si substrate 11. An oxide film (first oxide film) 31 having a film thickness of about 5 to 10 nm is formed on part of the periphery. The oxide film 31 is formed by forced oxidation due to local heating with light oscillated by the laser oscillator 4.

A lower insulating film 41 is formed on the workpiece 10. Contact plugs 43a, 43b, 43c connected to semiconductor devices such as transistors (not shown) are formed in the lower insulating film 41. A stopper film 51 of silicon carbide (SiC), silicon carbonitride (SiCN), $Si_3N_4$, silicon oxycarbide (SiOC), $SiO_2$ or the like is provided on the lower insulating film 41.

On the stopper film 51 is provided an upper insulating film 61 of $SiO_2$, methylsilsesquioxane polymer (MSQ, $CH_3SiO_{1.5}$), hydrosilsesquioxane polymer (HSQ, H—$SiO_{1.5}$), porous HSQ (H—$SiO_x$), porous MSQ ($CH_3$—$SiO_x$), organic silica, polytetrafluoroethylene (PTFE), polyarylether (PAE), porous PAE, benzocyclobutene (BCB) or the like. Recesses are formed in the upper insulating film 61 and the stopper film 51. The recesses comprise via holes 63a, 63b, 63c exposing the contact plugs 43a, 43b, 43c and interconnect grooves 65a, 65b, 65c continued to the via holes 63a, 63b, 63c.

Figure 12:
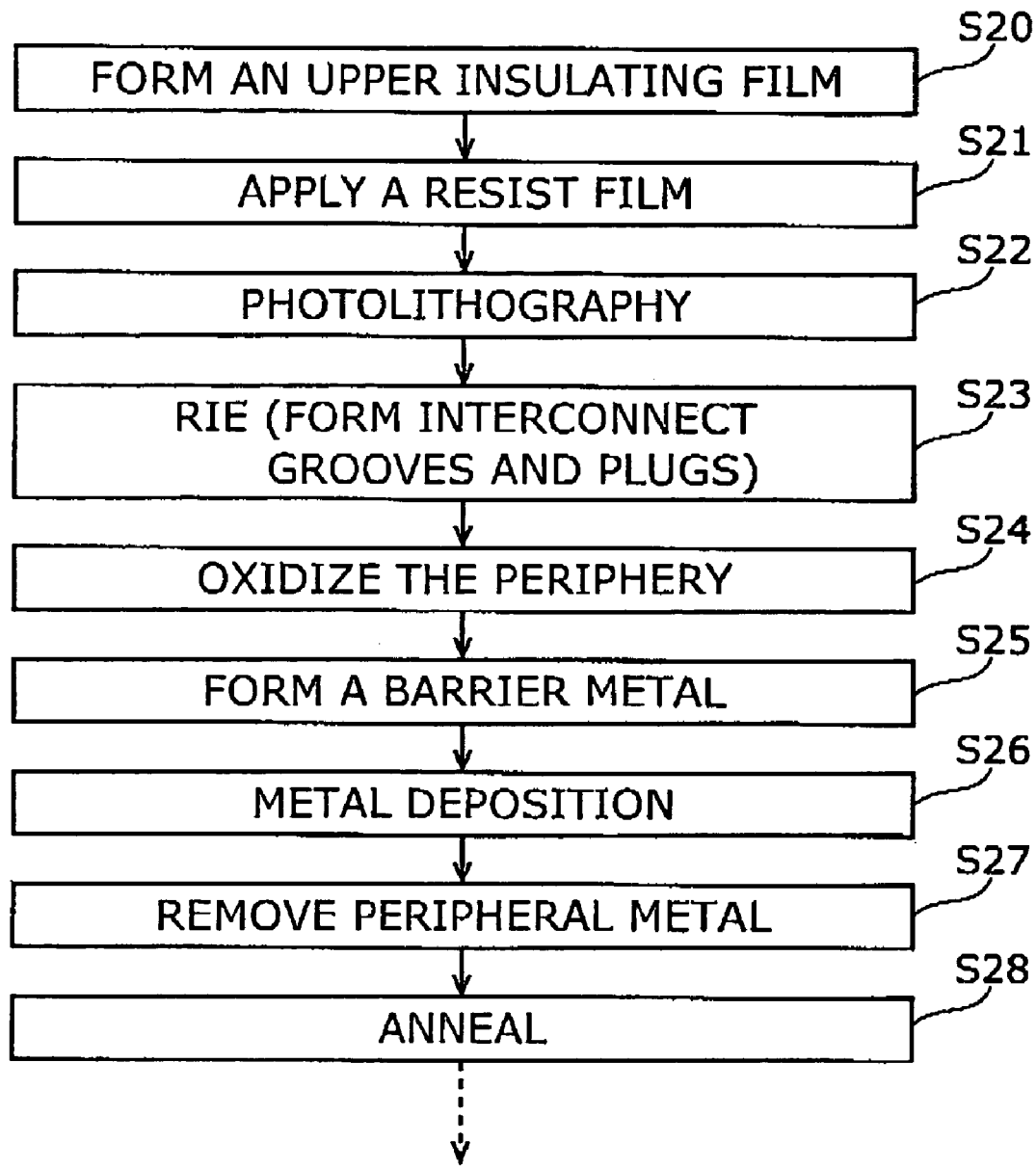
FIG. 12 is a flow chart illustrating an example peripheral processing method according to the variation of the first embodiment of the invention.

A method of manufacturing a semiconductor device based on the peripheral processing method according to the variation of the first embodiment is described with reference to the flow chart shown in FIG. 12. Here, a description is given of an example process subsequent to forming a first insulating film 21 on the backside and periphery of the Si substrate 11 shown in FIG. 11, a lower insulating film 41 on the frontside, contact plugs 43a, 43b, 43c embedded in the lower insulating film 41, and a stopper film 51 on the lower insulating film 41.

(a) In step S20, an upper insulating film 61 such as a $SiO_2$ film is deposited on the stopper film 51 by CVD or the like. In step S21, a resist film is applied onto the upper insulating film 61. In step S22, the resist film is developed by exposure using photolithography. In step S23, the resist film developed by exposure is used as an etching mask to etch the upper insulating film 61 and the stopper film 51 by RIE, thereby forming via holes 63a, 63b, 63c and interconnect grooves 65a, 65b, 65c exposing the top of the contact plugs 43a, 43b, 43c. Then a resist stripping system or the like is used to remove the resist film. It is assumed that the step of etching and the step of removing the resist film at this time have formed an exposed part 12 of Si in the first insulating film 21 on the periphery of the workpiece 10.

(b) In step 524, the exposed part 12 in the first insulating film 21 is irradiated with laser light directed from the laser oscillator 4 shown in FIG. 11, and the exposed part 12 is locally heated at about 1000° C., for example. The local heating can be conducted while rotating the stage 1a so as to heat a portion of the periphery located several millimeters outside the edge (end portion of the flat surface) of the Si substrate 11, for example. An oxide film 31 having a film thickness of about 5 to 10 nm, for example, is formed on the exposed part 12. Furthermore, a notch formed on the workpiece 10 is locally heated by the laser oscillator 4 or the like to oxidize the exposed part of the Si substrate 11.

(c) In step S25, a barrier metal is deposited in the via holes 63a, 63b, 63c and the interconnect grooves 65a, 65b, 65c in the upper insulating film 61 by sputtering, vacuum evaporation, CVD, atomic layer deposition (ALD) or the like. The barrier metal may be made of titanium (Ti), niobium (Nb), tantalum (Ta), ruthenium (Ru), tungsten (W), alloys composed of two or more thereof, and nitrides, oxides, carbides, and other compounds thereof.

(d) In step S26, electroplating or the like is used to bury a Cu or other metal film in the via holes 63a, 63b, 63c and the interconnect grooves 65a, 65b, 65c where the barrier metal has been deposited. Then CMP or the like is used to polish the metal film and the barrier metal until the surface of the upper insulating film 61 is exposed. In step S27, the metal film and the barrier metal formed on the periphery of the workpiece 10 are removed. In step 528, the workpiece 10 is heat treated. At this time, because the oxide film 31 has been formed on the exposed part 12 formed in the first insulating film 21 on the periphery, the metal left unremoved on the periphery does not react with the Si substrate 11 and does not diffuse from the periphery into the Si substrate 11.

According to the method of manufacturing a semiconductor device in the variation of the first embodiment, an oxide film 31 thick enough for barrier capability against metal diffusion is formed beforehand on the exposed part 12 in the first insulating film 21 of Si on the periphery, the exposed part 12 having been generated as a result of etching, resist removal, CMP or the like. Thus it is possible to prevent metal materials from diffusing from the periphery into the Si substrate 11 during the formation of the surface interconnect layer. Therefore the Si substrate 11 is protected against metal contamination.

The variation of the first embodiment illustrates a structure where interconnect grooves 65a, 65b, 65c continued to the via holes 63a, 63b, 63c are formed in the upper insulating film 61 shown in FIG. 11. However, the manufacturing method according to the variation of the first embodiment can also be used as part of a process of manufacturing other interconnect layers in a multilayer interconnect structure. At this time, a considerable effect can be achieved even when only via holes or only interconnect grooves are formed as recesses in the insulating film.

Second Embodiment

Figure 13:
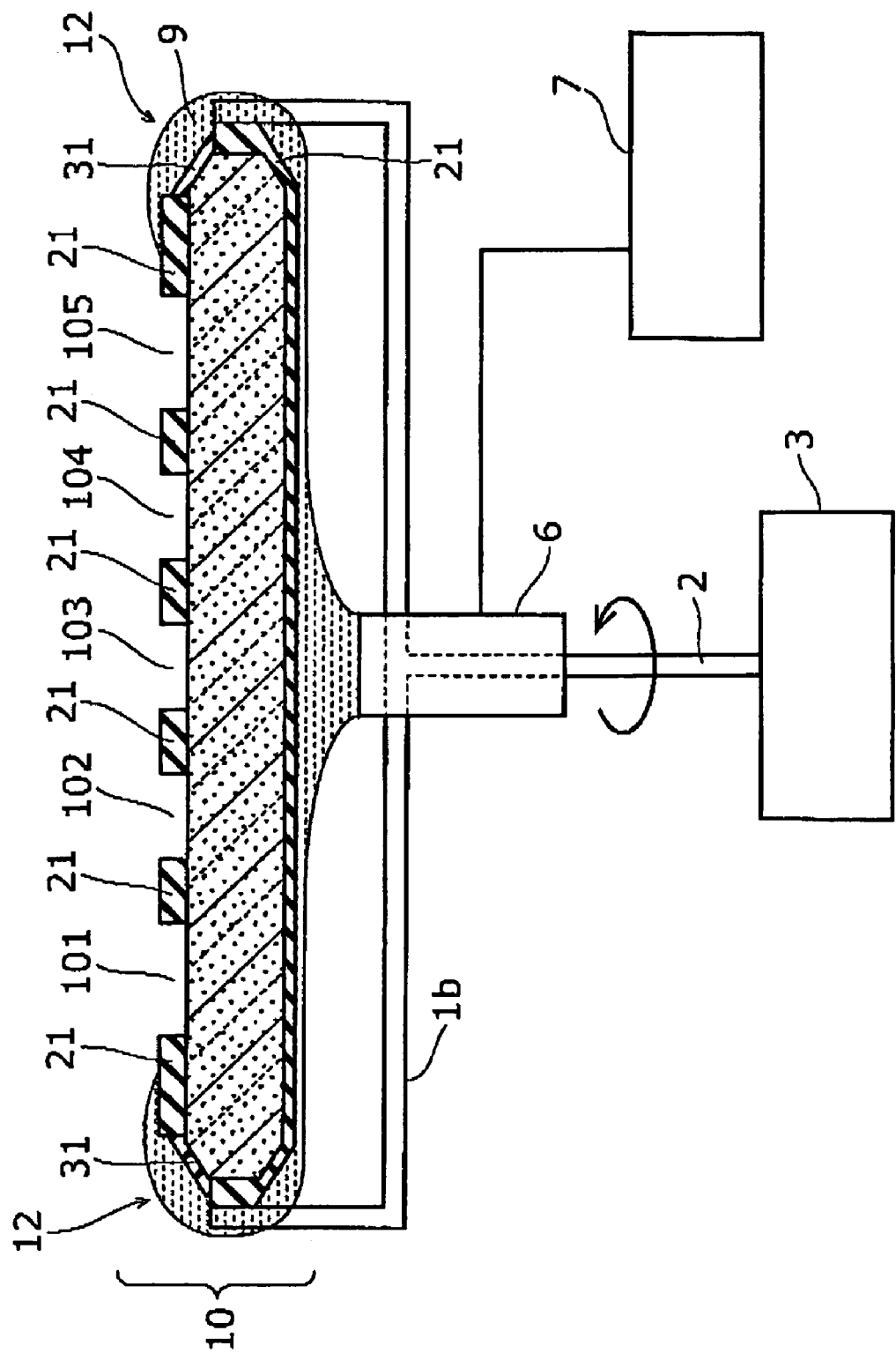
FIG. 13 is a schematic view illustrating an example peripheral processing apparatus according to a second embodiment of the invention.

As shown in FIG. 13, for example, a peripheral processing apparatus according to the second embodiment of the invention comprises a wafer chuck 1b for retaining a disc-shaped workpiece 10 on the periphery and a chemical solution supply nozzle 6 placed below the workpiece 10 for supplying a chemical solution 9 to the backside and periphery of the workpiece 10. The chemical solution supply nozzle 6 is connected to a chemical solution supply unit 7. The wafer chuck 1b is subjected to the rotary drive of a driving motor 3 via a rotary shaft 2, and hence can be rotary driven around the rotary shaft 2.

The ejected amount of the chemical solution 9 supplied through the chemical solution supply nozzle 6 is controlled by the chemical solution supply unit 7 depending on various characteristics of the workpiece 10 such as its size and the shape of the periphery, the number of rotations of the wafer chuck 1b, and the like. As shown in FIG. 13, the chemical solution 9 is supplied so as not to extend into the openings 101, 105 of the workpiece 10 and so as to entirely cover the periphery of the workpiece 10.

The chemical solution 9 may be a solution containing reacting activation species that promote oxidation. For example, cleaning chemical solutions such as hydrogen peroxide solution, ammonia solution ($NH_4OH$), hydrochloric acid (HCl), choline, tetramethylammonium hydroxide (TMAH), and ozone ($O_3$) water, or mixtures of any of these cleaning chemical solutions are available. This embodiment is substantially the same as the first embodiment otherwise.

Figure 14:
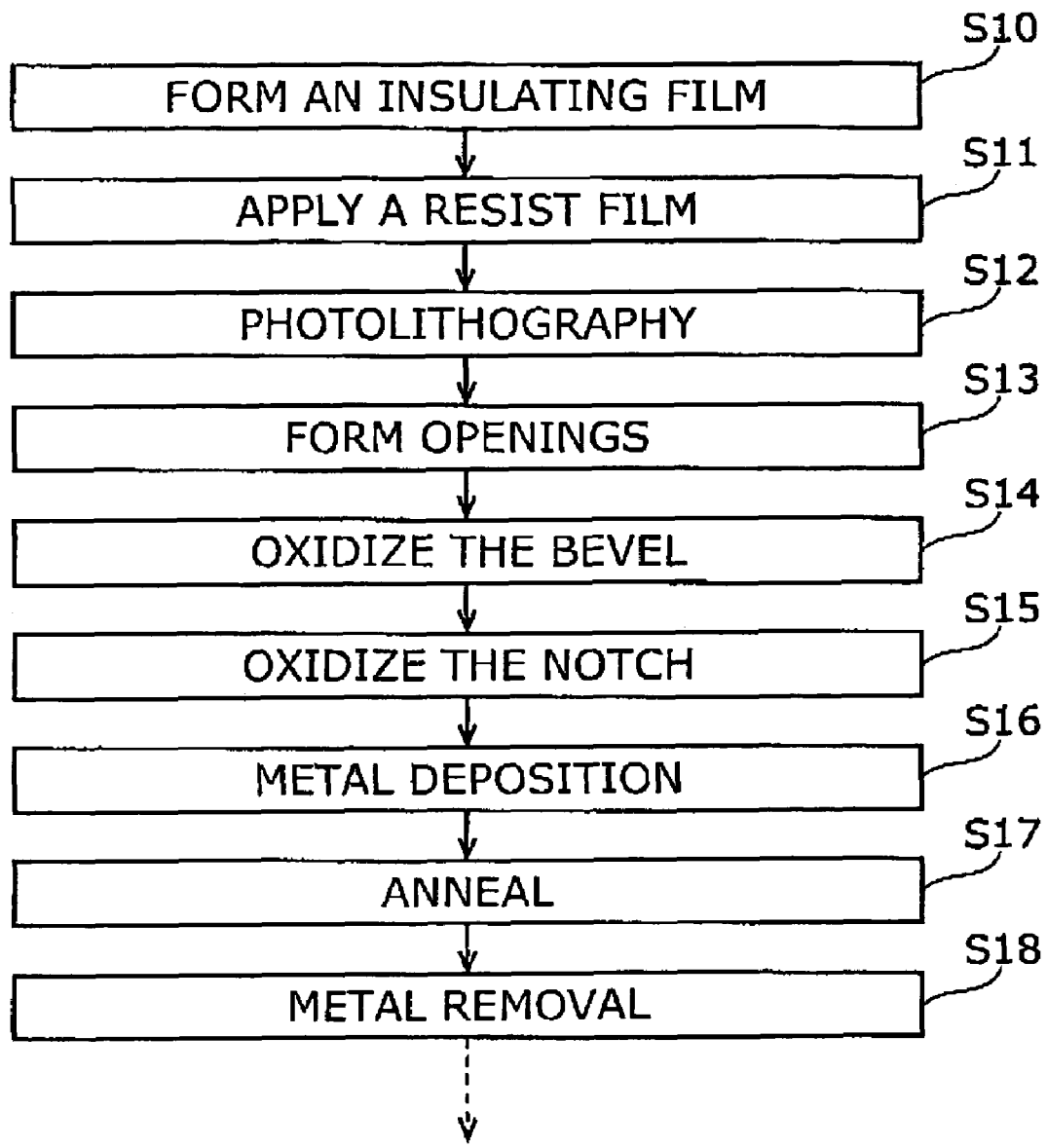
FIG. 14 is a flow chart illustrating an example peripheral processing method according to the second embodiment of the invention.

An example method of manufacturing a semiconductor device according to the second embodiment is described with reference to the flow chart of FIG. 14.

(a) In step S10, for example, an insulating film 21 of about 30 nm is formed on the frontside, backside, and periphery of the workpiece 10 including a Si substrate by CVD or the like. In step S11, a resist film is applied onto the frontside of the workpiece 10.

(b) In step S12, the resist film is developed by exposure using photolithography. The resist film is used as an etching mask to etch the insulating film 21 by RIE, thereby forming openings 101 to 105 in step 513. Thus part of the frontside of the Si substrate 11 is selectively exposed. At this time, an exposed part 12 of the Si substrate 11 may be formed on the periphery of the workpiece 10 due to nonuniform application or the like of the resist film. Then a resist stripping system or the like is used to remove the resist film applied on the insulating film 21.

(c) In step S14, the workpiece 10 with the insulating film 21 formed thereon is fixed using the wafer chuck 1b shown in FIG. 11. Then, while rotating the wafer chuck 1b, a chemical solution 9 containing reacting activation species that promote oxidation such as hydrogen peroxide solution is supplied through the chemical solution supply nozzle 6 onto the backside of the workpiece 10. The chemical solution 9 is supplied while the ejected amount is controlled by the chemical solution supply unit 7 so that the chemical solution 9 extends over the backside and periphery of the workpiece 10. As a result of the supply of the chemical solution 9, an oxide film (first oxide film) 31 is formed on the exposed part 12 of Si on the periphery, where the oxide film 31 is thicker than native oxide film formed on the surface.

(d) In step 515, the ejected amount is controlled by the chemical solution supply unit 7 so that the chemical solution 9 extends to the exposed part of Si formed in the notch of the workpiece 10. Thus, like the oxide film 31 shown in FIG. 13, an oxide film is formed in the notch, where the oxide film is thicker than native oxide film and has a thickness of about 0.7 to 2.0 nm, for example. Then the workpiece 10 is washed to remove the native oxide film formed in the openings 101 to 105 with a thickness of about 0.2 to 0.3 nm.

(e) In step S16, on the frontside of the workpiece 10 with the openings 101 to 105 formed thereon, a metal film of nickel (Ni) or the like is deposited with a thickness of 10 to 100 nm by sputtering. Subsequently, in step S17, heat treatment is conducted to allow the Si substrate 11 exposed in the openings 101 to 105 to selectively react with the metal film. Thus a silicide film of nickel silicide ($NiSi_2$) or the like is formed on the frontside of the Si substrate 11 exposed in the openings 101 to 105. Then, in step S18, the unreacted metal film is removed. At this time, the exposed part 12 formed on the periphery is protected against the formation of silicide film because the oxide film 31 has been formed on the exposed part 12.

According to the method of manufacturing a semiconductor device of the second embodiment, by supplying a chemical solution 9 through the chemical solution supply nozzle 6 onto the backside and periphery of the workpiece 10, an oxide film 31 having a thickness of about 0.7 to 2 nm is formed beforehand on the exposed part 12 of Si that has been exposed on the periphery as a result of nonuniform application of resist film, etching or the like. In general, a $SiO_2$ film having a thickness of 0.5 nm or more has barrier capability of a thickness of about 0.7 to 2 nm against metal diffusion. Thus it is possible to prevent silicide film from being formed on the periphery. Therefore the workpiece 10 is protected against metal contamination occurring from the periphery. Note that in the second embodiment, local heating by light irradiation can be used simultaneously with supplying the chemical solution containing reacting activation species to form an oxide film of about 2.0 to 10 nm. It is also understood that the peripheral processing apparatus according to the second embodiment is also applicable to a process of manufacturing a multilayer interconnect structure as described in the variation of the first embodiment.

Other Embodiments

The invention has been described above with reference to the first and second embodiment. However, the description and the drawings, which constitute part of this disclosure, are not to be understood as limiting the invention. Various alternative embodiments, implementations, and practical techniques will be apparent to those skilled in the art from this disclosure.

For example, the peripheral processing method according to the first and second embodiment can be applied to part of a process of manufacturing a MOS transistor as shown in FIGS. 15 to 30 to protect the workpiece against metal contamination occurring from the periphery of a silicon-based substrate. In the following, another embodiment of selectively supplying reacting activation species to the periphery of the workpiece is illustrated with reference to a process of manufacturing a MOS transistor on a $p^+$-type silicon substrate 71. However, it is understood that this embodiment is also applicable to various other processes of manufacturing semiconductor devices.

Figure 15:
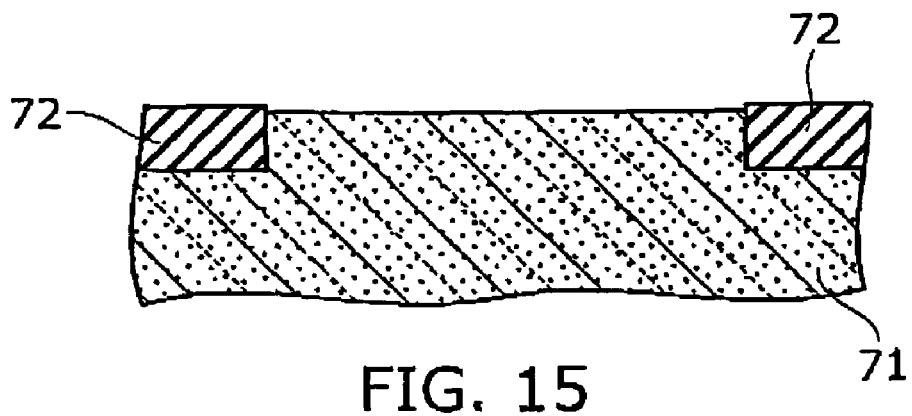
FIGS. 15 to 30 are process cross sections illustrating an example peripheral processing method according to another embodiment of the invention.
Figure 16:
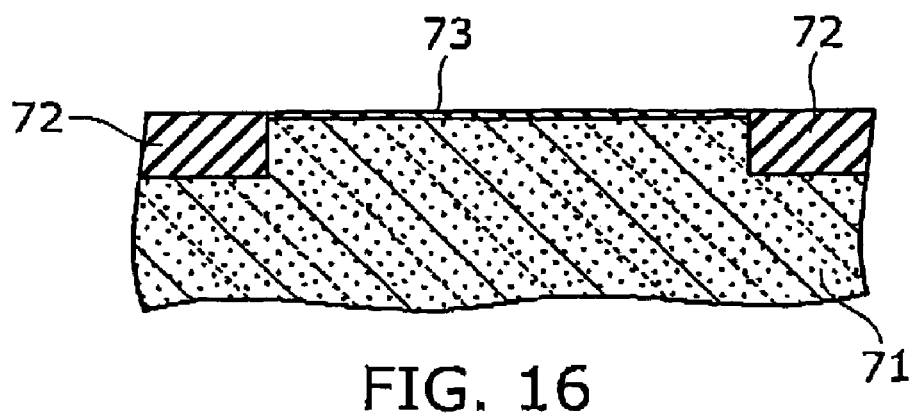
Figure 17:
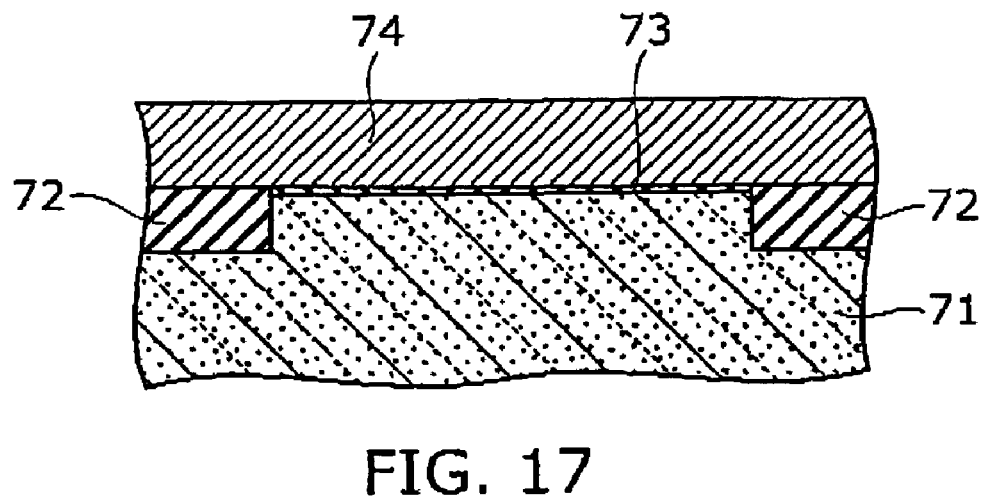
Figure 18:
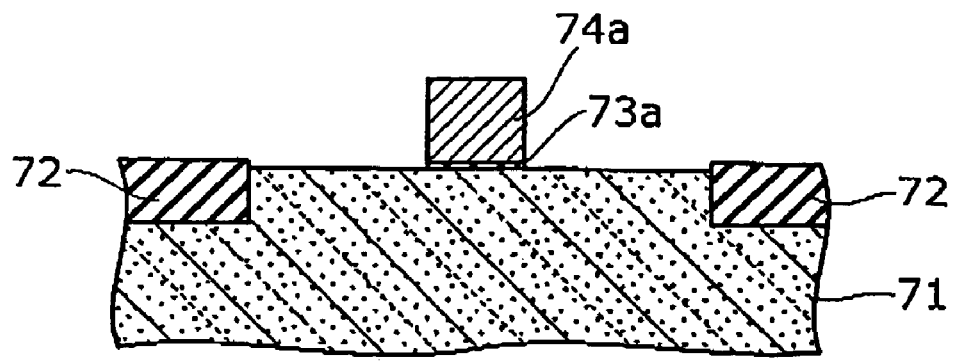

(a) As shown in FIG. 15, a field insulating film 72 for device isolation is formed on a $p^+$-type silicon substrate 71. Then, as shown in FIG. 16, a gate insulating film 73 is formed on the device region of the $p^+$-type silicon substrate 71. As shown in FIG. 17, a polycrystalline silicon film 74 is formed on the gate insulating film 73. A photoresist film is applied onto the polycrystalline silicon film 74 and patterned by photolithography. As shown in FIG. 18, the patterned photoresist film is used to form a gate insulating film 73a and a gate electrode 74a on the $p^+$-type silicon substrate 71.

Figure 19:
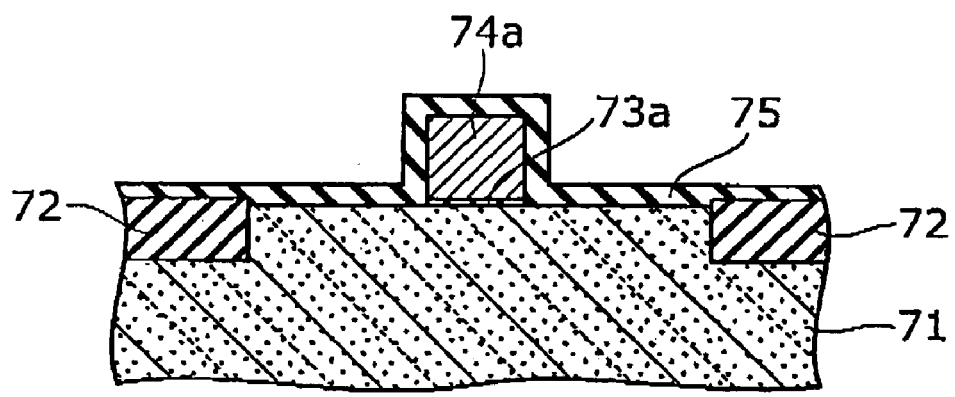
Figure 20:
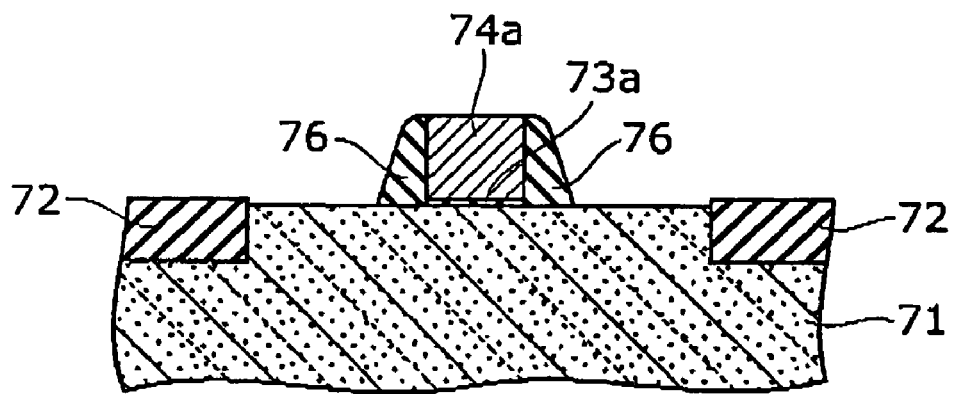
Figure 21:
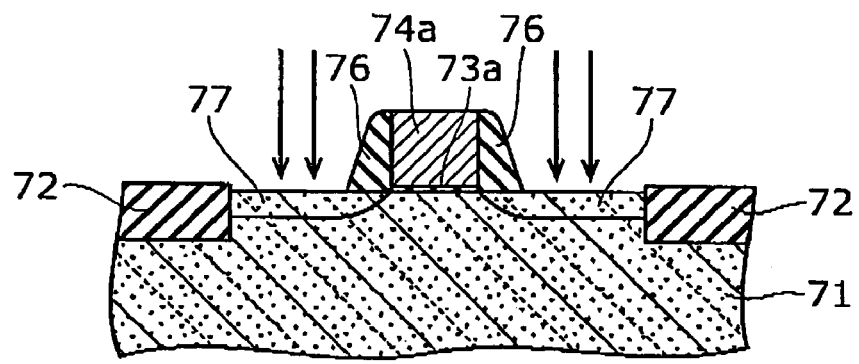

(b) The gate electrode 74a is used as a mask to selectively implant n-type impurity ions such as phosphorus (P) or arsenic (As) into the $p^+$-type silicon substrate 71, thereby forming an extension region (not shown). Then, as shown in FIG. 19, a silicon oxide film 75 is deposited by CVD on the $p^+$-type silicon substrate 71, the field insulating film 72, the gate insulating film 73a, and the gate electrode 74a. As shown in FIG. 20, a sidewall insulating film 76 is formed on the sidewall of the gate insulating film 73a and the gate electrode 74a by anisotropic etching. Then, as shown in FIG. 21, n-type impurity ions such as phosphorus (P) or arsenic (AS) are selectively implanted into the $p^+$-type silicon substrate 71. At this time, an exposed part of Si may be formed on the periphery of the $p^+$-type silicon substrate 71 as a result of nonuniform application of the resist film or the like, and n-type impurity ions may be implanted into the periphery of the $p^+$-type silicon substrate 71. Then, the implanted ions are activated by rapid heat treatment at 1050° C. for 10 seconds to form a diffusion region 77.

Figure 22:
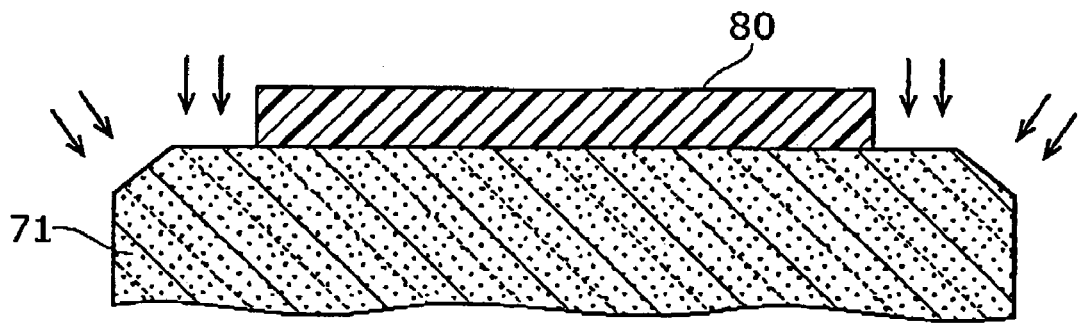
Figure 23:
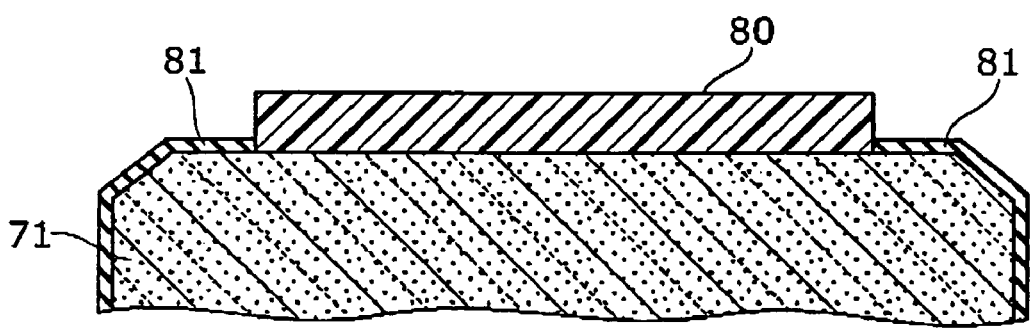
Figure 24:
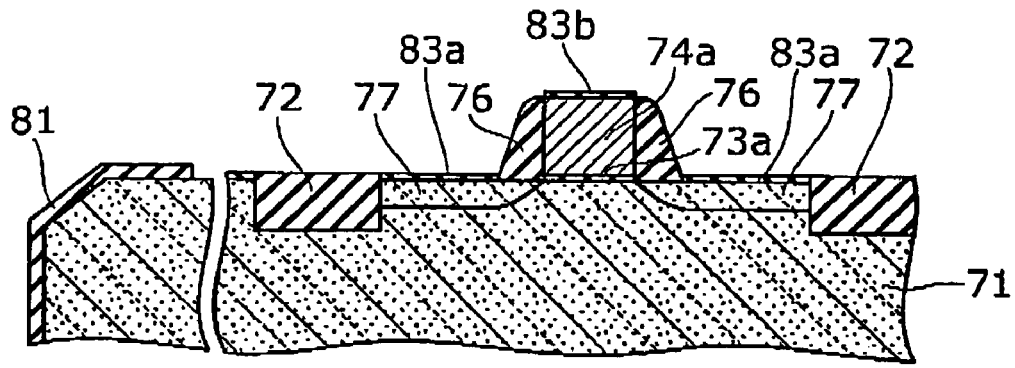
Figure 25:
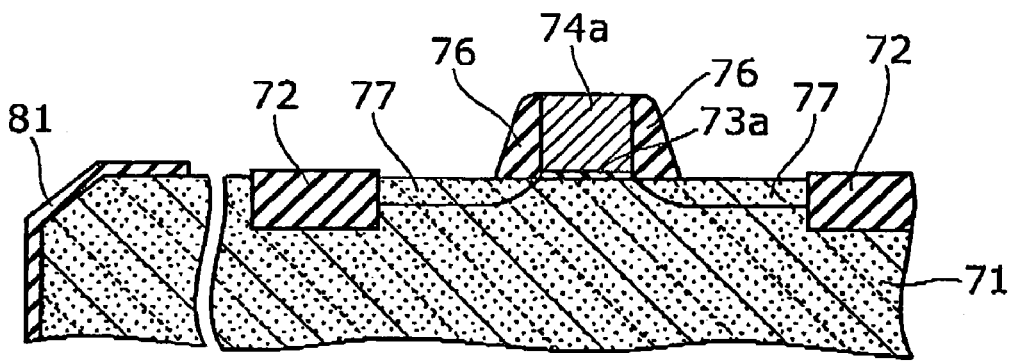

(c) The frontside of the $p^+$-type silicon substrate 71 is covered with a resist film 80. As shown in FIG. 22, n-type impurity ions such as phosphorus (P) or arsenic (As) serving as reacting activation species are selectively implanted into the periphery of the $p^+$-type silicon substrate 71, and then the resist film 80 is stripped off. The ion implantation condition is specified so that the amount of implantation is comparable to or more than that for the diffusion region 77. For example, the implantation energy may be 5 to 15 keV, and the dose amount may be $1\times10^{13}$ to $5\times10^{15}$ cm$^{-2}$. Consequently, as shown in FIG. 23, an oxide film (first oxide film) 81 containing phosphosilicate glass (PSG) or arsenosilicate glass (ASG) having a film thickness of about 5 to 10 nm is formed on the periphery of the $p^+$-type silicon substrate 71. Then, as shown in FIG. 24, a chemical solution such as dilute hydrofluoric acid (DHF), or a downflow gas such as $NF_3$, $H_2$, $N_2$, or $NH_3$ is used to remove native oxide films 83a, 83b formed on the diffusion region 77 and the gate electrode 74a. An oxide film 81 is formed on the periphery of the $p^+$-type silicon substrate 71, where the oxide film 81 is thicker than the native oxide films 83a, 83b formed on the surface of the diffusion region 77 and the gate electrode 74a because the oxidation rate of silicon increases with the increase of the implanted amount of impurity ions. Consequently, as shown in FIG. 25, part of the oxide film 81 is left unremoved on the periphery.

Figure 26:
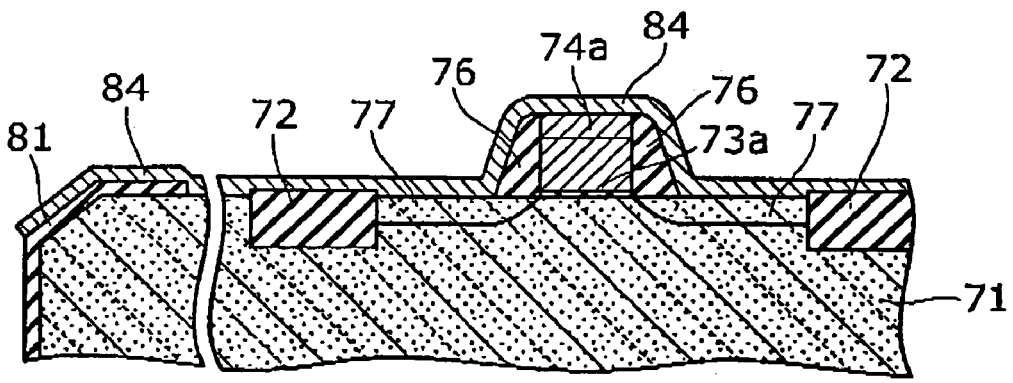
Figure 27:
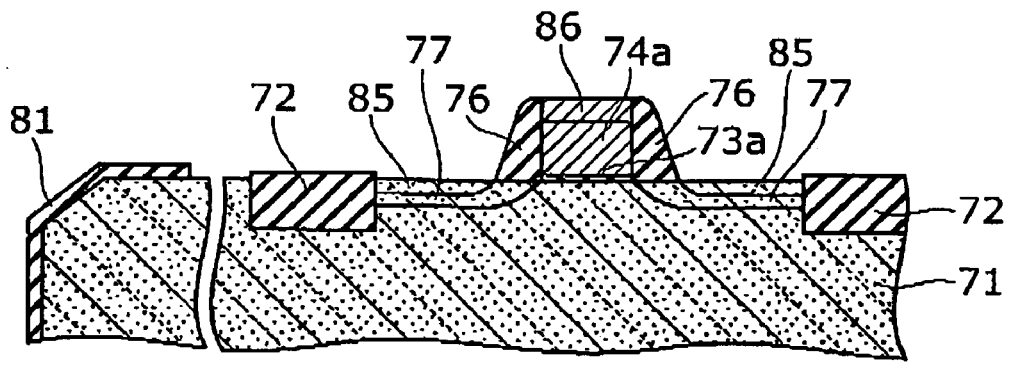

(d) As shown in FIG. 26, a metal film 84 of Co, Ni, Pd, Pt, Nd, Er, or a laminated film or alloy thereof is grown by sputtering on the frontside of the $p^+$-type silicon substrate 71. After the metal film 84 is grown, the metal film 84 is allowed to react with the silicon portion of the gate electrode 74a and with the silicon portion of the diffusion region 77 by rapid heat treatment. Then the unreacted metal film 84 and the metal film 84 attached to the periphery of the $p^+$-type silicon substrate 71 are removed. Consequently, as shown in FIG. 27, a silicide film 86 is formed on the gate electrode 74a. A silicide film 85 is formed on the diffusion region 77. The periphery of the $p^+$-type silicon substrate 71 is protected against the formation of silicide film because the oxide film 81 has already been formed thereon and hence the metal film 84 has no contact with the silicon portion of the $p^+$-type silicon substrate 71.

Figure 28:
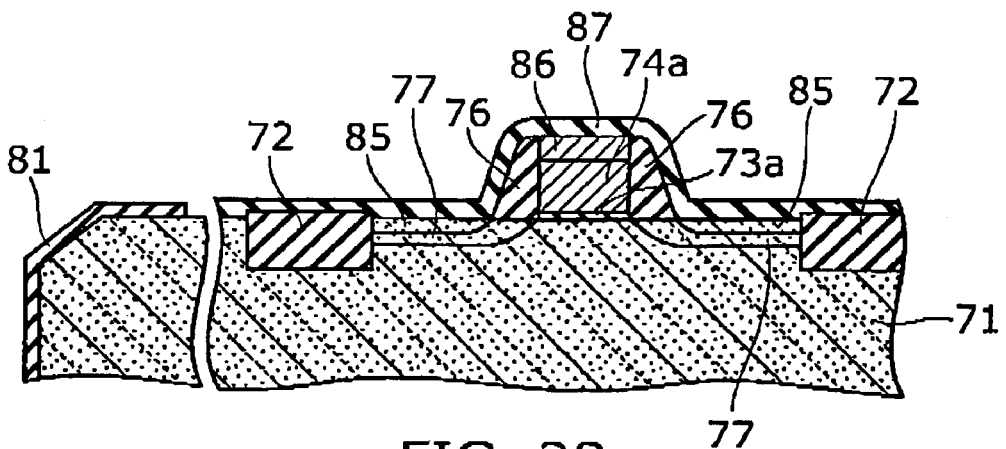
Figure 29:
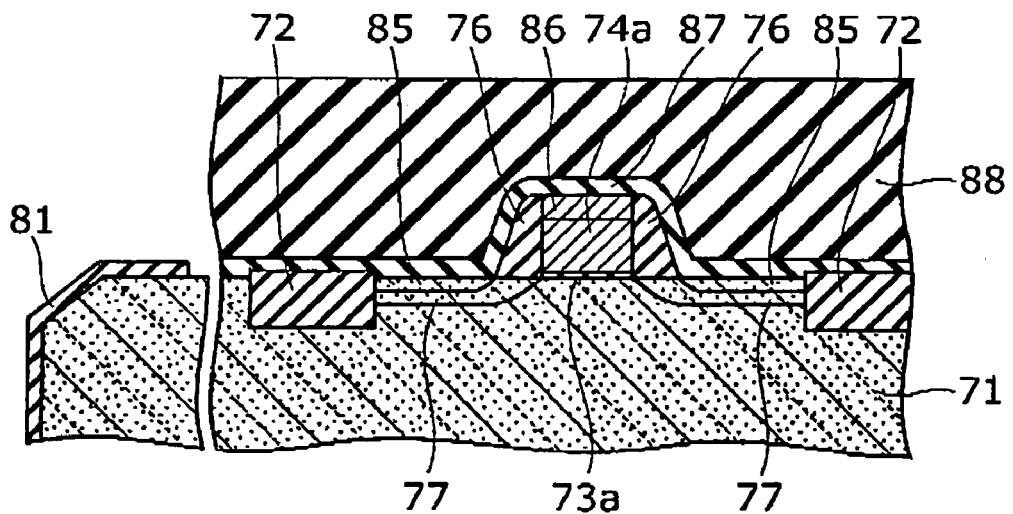
Figure 30:
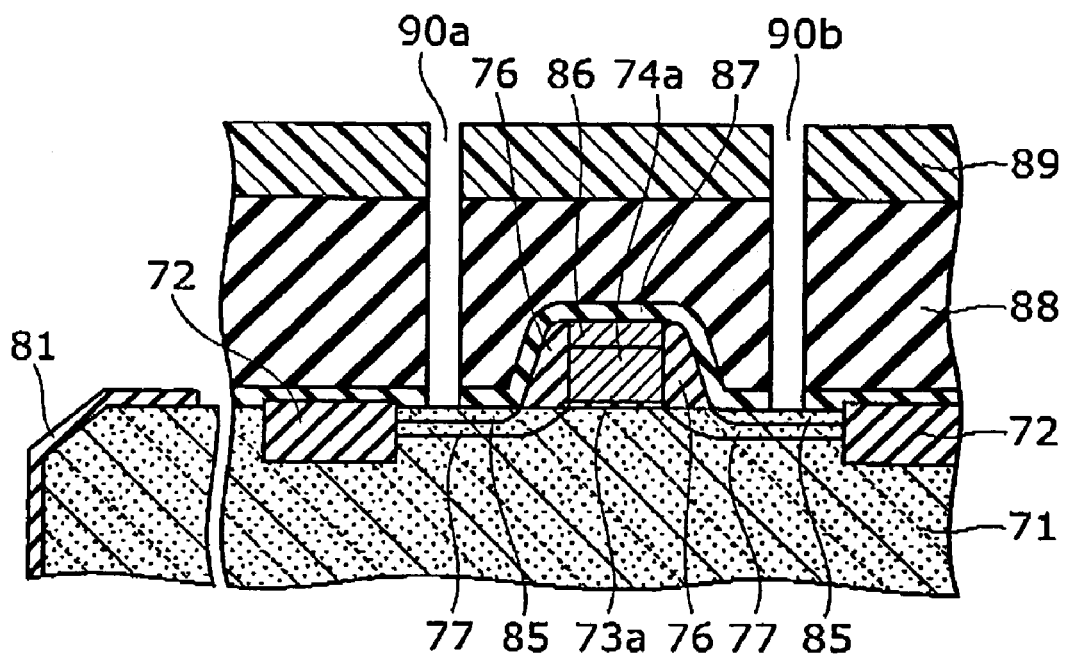

(e) As shown in FIG. 28, a nitride film 87 is grown by LP-CVD on the frontside of the $p^+$-type silicon substrate 71. As shown in FIG. 29, an insulating film 88 such as a NSG film is grown on the surface of the nitride film 87, and the surface is planarized by CMP. A photoresist film is applied onto the surface of the insulating film 88 and patterned by photolithography. The patterned photoresist film 89 is used as a mask to form contact holes 90a, 90b reaching the diffusion region 77. After the contact holes 90a, 90b are formed, a downflow gas such as $NF_3$, $H_2$, $N_2$, or $NH_3$ is used to remove native oxide film (not shown) formed on the surface of the diffusion region 77. Then consecutive processing in a vacuum is conducted to grow a titanium film by MO-CVD and a titanium nitride film by PVD or the like. The contact plugs are filled with tungsten or aluminum by MO-CVD, and interconnects of copper, aluminum or the like are formed on the contact plugs. Thus a MOS transistor is completed.

In the manufacturing process shown in FIGS. 15 to 30 again, selectively supplying the periphery of the p$^+$-type silicon substrate 71 with impurity ions serving as reacting activation species allows the oxidation rate on the periphery to be higher than the oxidation rate of native oxide films 83a, 83b on the surface of the diffusion region 77 and the gate electrode 74a. Thus an oxide film 81 thicker than the native oxide films 83a, 83b can be formed on the periphery. Therefore it is possible to prevent metal contamination occurring from the periphery of the p$^+$-type silicon substrate 71 during forming the silicide films 85, 86 on the p$^+$-type silicon substrate 71. Furthermore, because there is no need to use a jig such as an edge cut ring, there is no particle generation due to contact of the substrate with the edge cut ring, and the manufacturing yield can be increased. Note that the selective supply of impurity ions described here is also applicable to a process of manufacturing a multilayer interconnect structure as described in the variation of the first embodiment. Moreover, as in the first and second embodiment, on the periphery of the p$^+$-type silicon substrate 71 with an insulating film such as a silicon oxide film or a silicon nitride film formed thereon, the exposed part of the Si substrate generated as a result of non-uniform application of resist film or the like may be selectively supplied with impurity ions to form a thick oxide film 81.

It is understood that the invention encompasses various embodiments other than those described herein. Therefore the scope of the invention is to be determined solely by the subject matters defined in the appended claims in light of the above description.

The invention claimed is:

1. A peripheral processing method comprising:
by at least one of locally heating the periphery of a workpiece including a silicon-based substrate and selectively supplying reacting activation species to the periphery, allowing oxidation rate on the periphery to be higher than oxidation rate of native oxide film on a surface of the silicon-based substrate, thereby forming a first oxide film along the periphery, the first oxide film being thicker than the native oxide film.

2. The peripheral processing method according to claim 1, wherein the locally heating the periphery Includes an irradiation of light.

3. The peripheral processing method according to claim 2, wherein, during the locally heating the periphery, the first oxide film is formed while a reactive gas is supplied to the periphery of the workpiece.

4. The peripheral processing method according to claim 1, wherein the selectively supplying reacting activation species to the periphery includes supplying a chemical solution, the chemical solution including the reacting activation species which promote the oxidation of the silicon-based substrate.

5. The peripheral processing method according to claim 4, wherein the chemical solution is supplied while rotating the workpiece.

6. The peripheral processing method according to claim 1, wherein the selectively supplying reacting activation species to the periphery includes introducing an impurity into the periphery.

7. The peripheral processing method according to claim 6, wherein the impurity promotes the oxidation of the silicon-based substrate.

8. The peripheral processing method according to claim 6, wherein the introducing the impurity is performed by an ion implantation.

9. A method of manufacturing a semiconductor device comprising:
forming an insulating film on a frontside and periphery of a silicon-based substrate;
forming a workpiece by selectively etching away the insulating film to expose a portion of the frontside of the silicon-based substrate;
forming a first oxide film at an exposed part of the silicon-based substrate, the exposed part being formed in the Insulating film of the periphery during the selective etching;
depositing a metal film on the frontside of the workpiece after the first oxide film is formed; and
allowing the metal film to react with the portion of the frontside of the silicon-based substrate by heat treatment.

10. The method of manufacturing a semiconductor device according to claim 9, wherein the first oxide film is thicker than a native oxide film which is formed on the portion of the frontside of the silicon-based substrate.

11. The method of manufacturing a semiconductor device according to claim 10, further comprising removing the native oxide film after the first oxide film is formed and before the metal film is deposited.

12. The method of manufacturing a semiconductor device according to claim 9, wherein the forming the first oxide film includes locally heating the exposed part of the silicon-based substrate by a light irradiation.

13. The method of manufacturing a semiconductor device according to claim 12, wherein, during the locally heating, the first oxide film is formed while a reactive gas is supplied to a surface of the exposed part of the silicon-based substrate.

14. The method of manufacturing a semiconductor device according to claim 9, wherein the forming the first oxide film includes supplying the exposed part of the silicon-based substrate with a chemical solution.

15. The method of manufacturing a semiconductor device according to claim 14, wherein the chemical solution includes reacting activation species which promote an oxidation of the silicon-based substrate.

16. The method of manufacturing a semiconductor device according to claim 14, wherein the chemical solution is supplied while rotating the workpiece.

17. The method of manufacturing a semiconductor device according to claim 9, wherein the forming the first oxide film includes introducing an impurity into the exposed part.

* * * * *